United States Patent
Cho et al.

(10) Patent No.: US 7,184,316 B2
(45) Date of Patent: Feb. 27, 2007

(54) NON-VOLATILE MEMORY CELL ARRAY HAVING COMMON DRAIN LINES AND METHOD OF OPERATING THE SAME

(75) Inventors: In-Wook Cho, Yongin-si (KR); Geum-Jong Bae, Incheon-si (KR); Ki-Chul Kim, Suwon-si (KR); Byoung-Jin Lee, Seoul (KR); Jin-Hee Kim, Seongnam-si (KR); Byou-Ree Lim, Yongin-si (KR); Sang-Su Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 23 days.

(21) Appl. No.: 11/038,726

(22) Filed: Jan. 19, 2005

(65) Prior Publication Data

US 2005/0162925 A1 Jul. 28, 2005

(30) Foreign Application Priority Data

Jan. 27, 2004 (KR) ............... 10-2004-0005155

(51) Int. Cl.
*G11C 16/04* (2006.01)
(52) U.S. Cl. ............... 365/185.28; 365/185.18; 365/185.29
(58) Field of Classification Search ........... 365/185.28, 365/185.18, 185.29
See application file for complete search history.

(56) References Cited

U.S. PATENT DOCUMENTS

| | | | |
|---|---|---|---|
| 5,999,444 A * | 12/1999 | Fujiwara et al. | 365/185.02 |
| 6,370,064 B1 * | 4/2002 | Kim | 365/185.29 |
| 6,501,681 B1 | 12/2002 | Van Buskirk et al. | 365/185.22 |
| 6,720,614 B2 | 4/2004 | Lin et al. | 257/316 |

FOREIGN PATENT DOCUMENTS

| KR | 01-102748 | 11/2001 |
|---|---|---|
| KR | 03-34327 | 5/2003 |
| KR | 10-2003-0094497 | 12/2003 |

* cited by examiner

*Primary Examiner*—Huan Hoang
(74) *Attorney, Agent, or Firm*—Mills & Onello LLP (57) ABSTRACT

A nonvolatile memory cell array having common drain lines and method of operating the same are disclosed. A positive voltage is applied to a gate of a selected cell and gates of memory cells that share a word line with the selected cell. A first voltage is applied to a drain of the selected cell and drains of the memory cells that share at least a drain line with the selected cell. A second voltage is applied to a source of the selected cell and sources of memory cells that share a bit line with the selected cell, the second voltage being less than the first voltage, such that electrons are injected into the charge storage region of the selected cell to program. A third voltage, which is higher than the second voltage, is applied to bit lines that are not connected to the selected cell.

32 Claims, 3 Drawing Sheets

NON-VOLATILE MEMORY CELL ARRAY HAVING COMMON DRAIN LINES AND METHOD OF OPERATING THE SAME

CROSS-REFERENCE TO RELATED APPLICATION

This application claims the benefit of Korean Patent Application No. 2004-5155, filed on Jan. 27, 2004, the contents of which are hereby incorporated herein by reference in their entirety.

BACKGROUND OF THE INVENTION

1. Field of the Invention

The present invention relates to a nonvolatile memory device and, more particularly, to a nonvolatile memory cell array having common drain lines and a method of operating the same.

2. Description of the Related Art

Unlike a volatile memory device, a nonvolatile memory device maintains data even when power is not applied to the memory.

Generally, the nonvolatile memory device has a charge storage layer between a semiconductor substrate and a gate. Nonvolatile memory devices are largely classified into two types according to the structure of the charge storage layer: a floating gate type and an MNOS type.

The floating gate type of nonvolatile memory device has a structure including a tunnel dielectric layer, a floating gate, an inter-gate insulating layer, and a control gate, which are stacked on a semiconductor substrate. The floating gate where charge is stored is formed of a conductive layer.

The MNOS type of nonvolatile memory device has a metal nitride oxide semiconductor (MNOS) or a metal oxide nitride oxide semiconductor (MONOS) structure. That is, the nonvolatile memory device has a dielectric layer, acting as the charge storage layer, between the semiconductor substrate and the gate. The MNOS type of nonvolatile memory device stores data using a trap site in the dielectric layer and an interface thereof, for example, a trap site present in an interface between the dielectric layer and the semiconductor. In particular, in the case where the gate is formed of a polysilicon layer, the nonvolatile memory device has a silicon oxide nitride oxide semiconductor (SONOS) structure.

Figure 1:
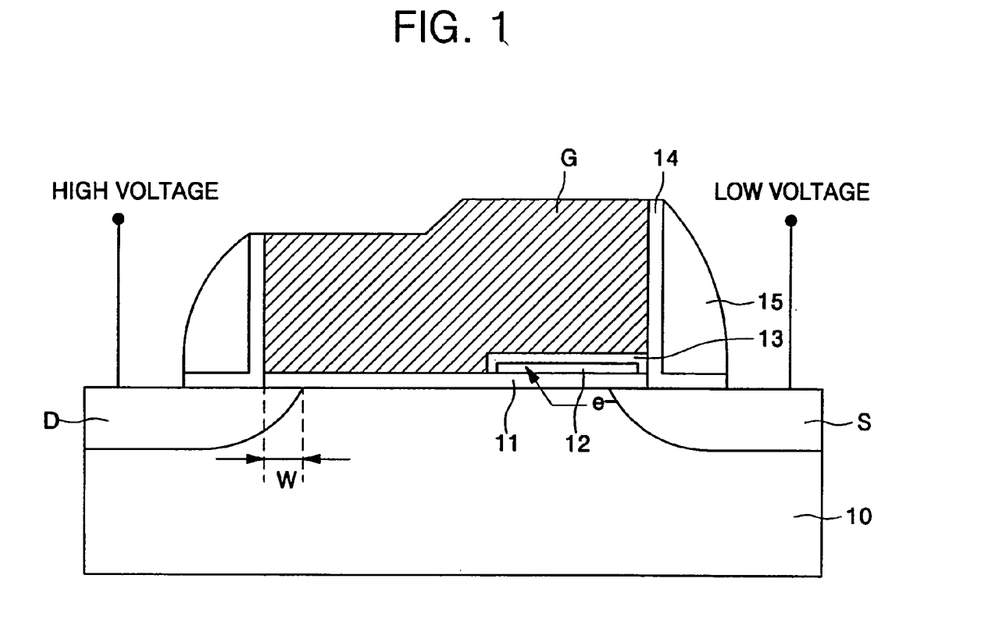
FIG. 1 is a cross-sectional view showing the structure of a SONOS nonvolatile memory device according to prior art.

Referring to FIG. 1, according to prior art, a nonvolatile memory device may include a tunnel dielectric layer 11, a trap dielectric layer 12, a Is blocking dielectric layer 13, a gate G, and source and drain S and D formed on a semiconductor substrate 10 at both sides of the gate G, which are stacked over the semiconductor substrate 10. The nonvolatile memory device may further include spacers 14 and 15 formed on sidewalls of the gate G. The tunnel dielectric layer 11, the trap dielectric layer 12, and the blocking dielectric layer 13 are formed of an oxide layer, a nitride layer, and an oxide layer, respectively. The trap dielectric layer 12 acts as a charge storage layer.

The nonvolatile memory device is programmed by channel hot electron injection (CHEI). To induce the CHEI, a strong lateral electric field is created between the source S and the drain D, for example, by applying a voltage of 5V to the gate G and applying voltages of 0V and 5V to the source S and the drain D, respectively. As a result, hot electrons are created in a channel region in the vicinity of the source S. The hot electrons are injected into an interface between the tunnel dielectric layer 11 and the trap dielectric layer 12, or the trap dielectric layer 12 beyond energy barriers of the semiconductor substrate 10 and the tunnel dielectric layer 11. This electron injection increases the threshold voltage of the nonvolatile memory device. Accordingly, applying a voltage less than the increased threshold voltage to the gate G cannot enable a current to flow through the programmed device. It allows the stored data to be read.

The nonvolatile memory device is erased by hot hole injection (HHI). To induce the HHI, for example, when a voltage of −10V is applied to the gate G, a voltage of 5V is applied to the source S, and the drain D and the semiconductor substrate 10 is applied with a ground voltage or floated, hot holes created between the source S and the substrate are injected into an interface between the tunnel dielectric layer 11 and the trap dielectric layer 12, or the trap dielectric layer 12, resulting in the erasing.

Because the conventional nonvolatile memory device shown in FIG. 1 is programmed by a strong lateral electric field between the source S and the drain D, a distance between the source S and the drain D should be small, if possible. Accordingly, an overlapped width W between the drain D and the gate G must be secured above a certain level.

Also, there is a problem that threshold voltages of unselected cells are increased since disturbance occurs in the cells that share bit and source lines with the selected cells in programming the memory cell array having the common source line structure. That is, in the unselected cell that is applied with voltages of 0V and 5V to the source and the drain in the above-mentioned programming process not by sharing the word line with the selected cell but by sharing the bit and source lines, a lateral electric field is created by a potential difference between the source and the drain. As the voltage applied to the drain is increased for the purpose of increasing the potential difference between the source and the drain, a depletion layer of the drain is expanded and accordingly is closer to the source, such that the drain depletion layer and the source depletion layer are completely connected to each other. Because in this state, the drain electric field affects the source side to degrade diffusion potential in the vicinity of the source, a current will flow between the source and the drain without a formed channel. Accordingly, there is a problem that the threshold voltage of the unselected cell is increased, thereby programming an unintended cell.

One approach to programming and erasing data in a P-channel SONOS memory cell is disclosed in U.S. Pat. No. 6,720,614, entitled, "Operation Method for Programming and Erasing a Data in a P-channel SONOS Memory Cell," issued to Hung-Sui Lin, et al.

SUMMARY OF THE INVENTION

Embodiments of the invention provide a nonvolatile memory cell array having common drain lines and method of operating the same.

In one aspect, the invention is directed to a method of operating an array of nonvolatile memory cells in which memory cells are arranged in a matrix, each of the memory cells comprising a semiconductor substrate, a gate formed on the semiconductor substrate, a source and a drain formed in the semiconductor substrate at both sides of the gate, and a charge storage region between the gate and the semiconductor substrate. A positive voltage is applied to a gate of a selected cell and gates of memory cells that share a word line with the selected cell. A first voltage is applied to a drain of the selected cell and drains of memory cells that share at least a drain line with the selected cell. A second voltage is applied to a source of the selected cell and sources of memory cells that share a bit line with the selected cell, the second voltage being less than the first voltage, such that electrons are injected into the charge storage region of the selected cell to program. A third voltage, which is higher than the second voltage, is applied to bit lines that are not connected to the selected cell.

In another aspect, the invention is directed to an array of nonvolatile memory cells in which the nonvolatile memory cells are arranged in a matrix. Each of the nonvolatile memory cells includes a gate formed on a semiconductor substrate and connected to a word line. A source connected to a bit line is formed in the semiconductor substrate at one side of the gate. A drain connected to a drain line is formed in the semiconductor substrate at the other side of the gate. A charge storage region is formed between the gate and the semiconductor substrate, wherein the charge storage region may be positioned closer to the drain than the source. The nonvolatile memory cells connected to at least two word lines are connected to a common drain line.

In one embodiment, the charge storage region has discrete charge trap sites. In one embodiment, the charge storage region is formed of a silicon oxide layer, a silicon nitride layer, and a silicon oxide layer, which are stacked over the semiconductor substrate. In one embodiment, the semiconductor substrate is a p-type conductive substrate and the source includes an $n^-$ source expansion region partially overlapped with the gate and an n+ source region adjacent to the $n^-$ source expansion region. The drain can includes an $n^-$ drain expansion region partially overlapped with the gate and an $n^+$ drain region adjacent to the $n^-$ drain expansion region and having a relatively higher concentration. A $p^-$ region can be formed adjacent to the bottom of the $n^-$ drain expansion region.

In one embodiment, a voltage ranging from 3.0V to 6.0V is applied to the gate of the selected cell and the gates of the nonvolatile memory cells that share the selected word line, and a voltage of 0V is applied to unselected word lines. In one embodiment, a voltage ranging from 3.0V to 6.0V is applied as the first voltage. In one embodiment, a voltage ranging from 0V to 1.0V is applied as the second voltage. In one embodiment, a voltage ranging from 0V to 6.0V is applied as the third voltage.

In one embodiment, the method further comprises applying a negative voltage to the gates of the nonvolatile memory cells, applying a positive voltage to the drains of the nonvolatile memory cells, and allowing the sources of the nonvolatile memory cells to be grounded or floated so that electrons in the charge storage region are erased. In one embodiment, erasing the electrons in the charge storage region is performed by applying a voltage ranging from –6.0 V to –5.0 V to the gates and applying a voltage ranging from 5.0 V to 6.0 V to the drains.

In one embodiment, the charge storage region includes a dielectric layer formed on the semiconductor substrate.

BRIEF DESCRIPTION OF THE DRAWINGS

The foregoing and other objects, features and advantages of the invention will be apparent from the more particular description of a preferred embodiment of the invention, as illustrated in the accompanying drawings. The drawings are not necessarily to scale, emphasis instead being placed upon illustrating the principles of the invention.

DETAILED DESCRIPTION OF THE INVENTION

The present invention will now be described more fully hereinafter with reference to the accompanying drawings, in which exemplary embodiments of the invention are shown. In the drawings, the thickness of the layers and regions are exaggerated for clarity.

Figure 2:
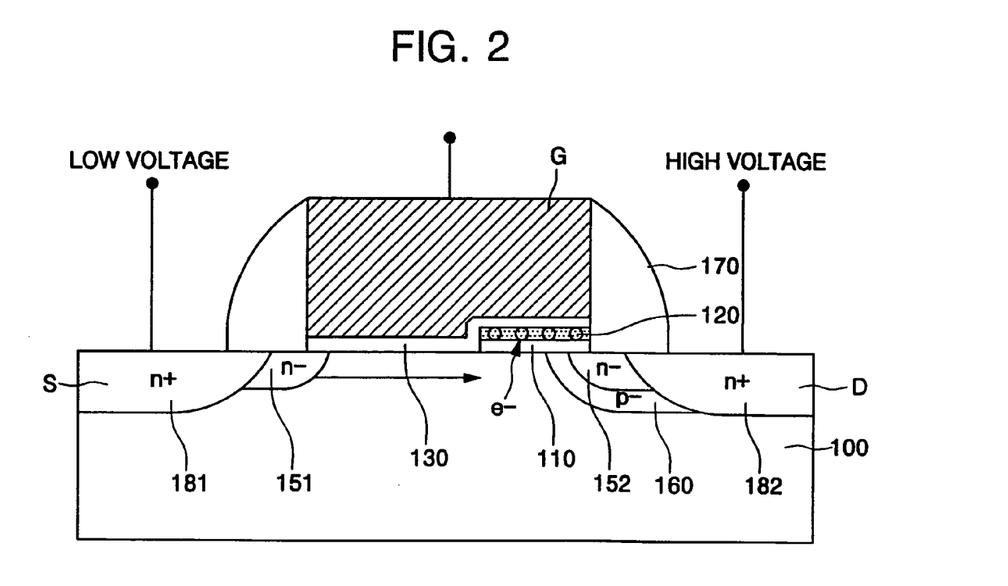
FIG. 2 is a cross-sectional view showing the structure of a nonvolatile memory device to which an operating method according to an embodiment of the present invention is applied.

Referring to FIG. 2, a nonvolatile memory cell, to which an operating method according to an embodiment of the present invention is applied, may include a tunnel dielectric layer 110, a trap dielectric layer 120, a blocking dielectric layer 130, a gate G, and a source S and a drain D formed on the semiconductor substrate 100 at both sides of the gate G, Which are stacked over a p type semiconductor substrate 100. Spacers 170 may be formed on sidewalls of the gate G.

An interface between the tunnel dielectric layer 110 and the trap dielectric layer 120, and the trap dielectric layer 120 act as a charge storage region. The charge storage region has discrete charge tarp sites. The trap dielectric layer 120 may have a structure closer to the drain D than the source S. That is, the charge storage region may have the structure closer to the drain D than the source S. The blocking dielectric layer 130 prevents electrons, which have been injected into the trap dielectric layer 120, from leaking into the gate G and, at the same time, prevents holes from being injected from the gate G into the trap dielectric layer 120. The tunnel dielectric layer 110 and the blocking dielectric layer 130 may be formed of a silicon oxide layer, and the trap dielectric layer 120 may be formed of a silicon nitride layer. In addition, the gate electrode G may be formed of silicon. That is, the present invention may be applied to a method of operating a nonvolatile memory device having a local silicon oxide nitride oxide semiconductor (SONOS) gate structure.

Also, the tunnel dielectric layer 110 and the blocking dielectric layer 130 may be formed of an oxide layer, and the trap dielectric layer 120 may be formed of a high-k material, such as $HfO_2$, $ZrO_2$, $La_2O_3$ or $CeO_2$.

The source S may include an $n^-$ source expansion region 151 partially overlapped with the gate G, and an $n^+$ source region 181 adjacent to the $n^-$ source expansion region 151. The drain D may include an $n^-$ drain expansion region 152 partially overlapped with the gate G, and an $n^+$ drain region 182 adjacent to the $n^-$ drain expansion region 152. Because of the existence of the $n^-$ source expansion region 151 and the $n^-$ drain expansion region 152 which are partially overlapped with the gate G, a distance between the source S and the drain D is shorter, resulting in an increased lateral electric field. Further, the memory cell may include a $p^-$ pocket region 160 adjacent to the bottom of the $n^-$ drain expansion region 152. Because of the existence of the $p^-$ pocket region 160, the area of a depletion layer may be reduced, as compared to the case where the $n^-$ drain expansion region 152 is adjacent to the p+ semiconductor substrate 100, and accordingly band-to-band tunneling (BTBT) from the drain D to the semiconductor substrate 100 is increased so that the created hot holes and electrons are increased, thereby further improving programming/erasing efficiency.

Figure 3:
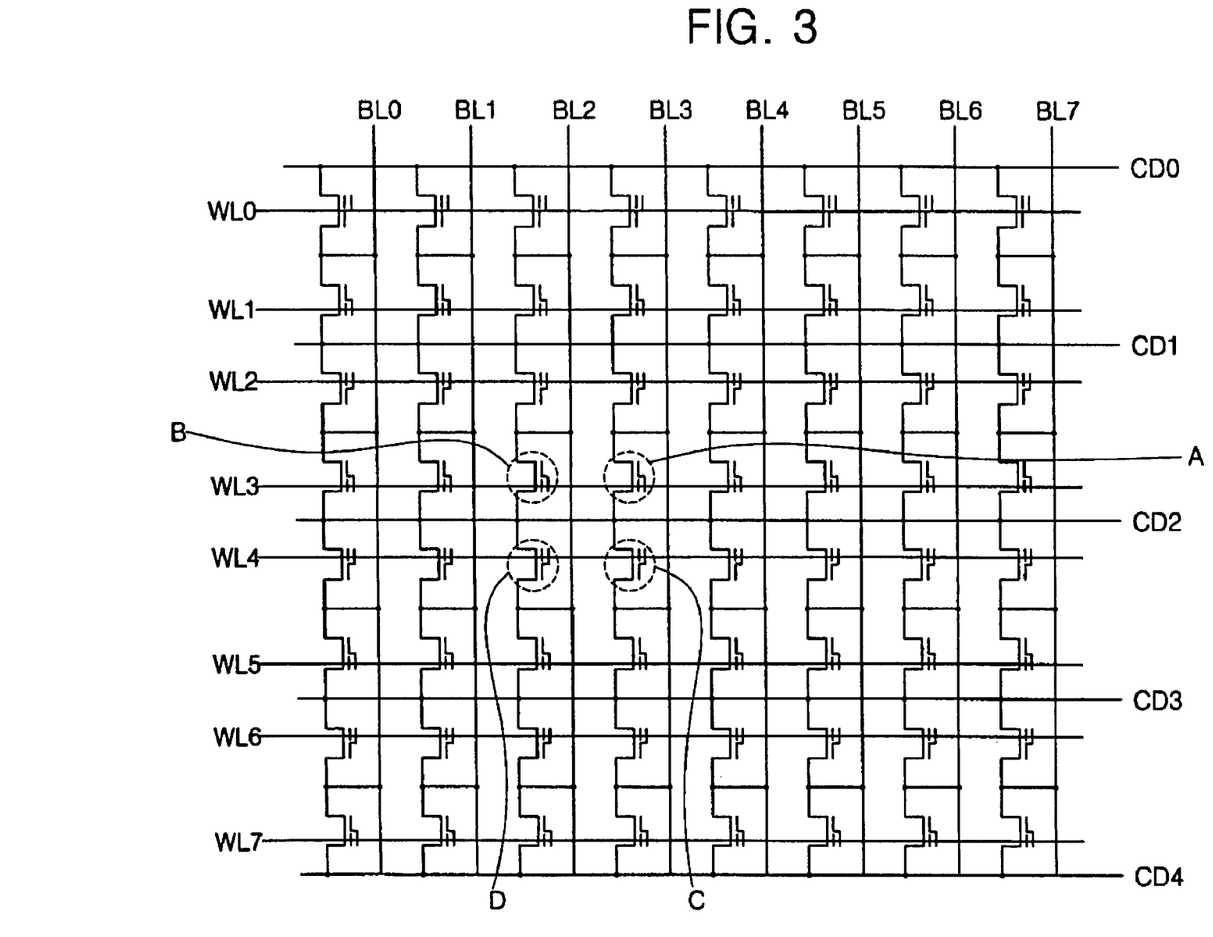
FIG. 3 shows an array of nonvolatile memory cells to which an operating method according to an embodiment of the present invention is applied.

Referring to FIG. 3, a nonvolatile memory cell array according to the present invention is disposed in a NOR type arrangement, in which a plurality of memory cells may be arranged in a matrix form. Each memory cell has a structure as shown in FIG. 2, and gates G, sources S and drains D of the respective memory cells are connected to word lines WL0–WL7, bit lines BL1–BL7 and drain lines CD0–CD4, respectively. Memory cells disposed on the same row share the same word lines WL0–WL7, and memory cells disposed on the same column share the same bit lines BL1–BL7. The cells sharing the same word line, namely, the cells on the same row, may share the drain lines CD0–CD4. In addition, the drain lines CD0–CD4 may be shared by the cells that are connected to at least two word lines or all memory cells may share one drain line.

Hereinafter, the method of operating the nonvolatile memory cell according to the present invention will be described with reference to FIGS. 2 and 3 and Table 1.

of the selected cell A. At this time, a voltage of 3.0V to 6.0V is applied to the drains of the unselected cells B, C and D that share the drain line CD2 with the selected cell A. On the other hand, in the case where all memory cells share one drain line therebetween, the same drain voltage may be applied to all of the drains of the selected cells and the unselected cells. And, a low voltage, for example, 0V to 1.0V is applied to the bit line BL3 that is connected to the source S of the selected cell A. In addition, a voltage higher than the low voltage, for example, 3.0V to 6.0V, is applied to the bit lines BL0-BL2 and BL4-BL7 other than the bit line BL3 connected to the source S of the selected cell A. The voltage applied to the bit lines BL0–BL2 and BL4–BL7 may be determined in the range of 0V to 6V depending on the voltage applied to the drain line CD2. Most preferably, the programming is carried out by determining the source and drain voltages of the unselected cells so that a potential difference is not generated between the source and the drain of the unselected cells C and D, which do not share the bit line with the selected cell A. The threshold voltage of the selected cell A which is programmed is increased, and thus

TABLE 1

| | Vwl[V] | | | | Vdl[V] | | | | Vbl[V] | | | | Vsub[V] | |
| | | | | | | | | | | | | | se-lected cell | unse-lected cell |
| | selected cell | unselected cell | | | Selected cell | Unselected cell | | | selected cell | unselected cell | | | | |
| | A | B | C | D | A | B | C | D | A | B | C | D | A | B, C, D |
| program | 3.0~6.0 | 3.0~6.0 | 0 | 0 | 3.0~6.0 | 3.0~6.0 | 3.0~6.0 | 3.0~6.0 | 0.1~1.0 | 3.0~6.0 | 0.1~1.0 | 3.0~6.0 | 0 | 0 |
| Erase | −6.0~−5.0 | −6.0~−5.0 | −6.0~−5.0 | −6.0~−5.0 | 5.0~6.0 | 5.0~6.0 | 5.0~6.0 | 5.0~6.0 | 0/float | 0/float | 0/float | 0/float | 0 | 0 |
| Read | 1.2~3.3 | 0 | 0 | 0 | 0 | 0 | 0 | 0 | 0.1~1.0 | 0 | 0 | 0 | 0 | 0 |

Table 1 shows a word line voltage Vwl, a drain line voltage Vdl, a bit line voltage Vbl, and a substrate voltage Vsub, which are applied in operations of programming, erasing and reading the selected cell A in the memory cell array shown in FIG. 3.

According to the present invention, the programming in the nonvolatile memory device is accomplished by applying a voltage to the gate and generating a potential difference between the drain and the source, so that electrons are injected into the charge storage layer of the selected cell to increase a threshold voltage. For example, a method of operating the selected cell A, and a first unselected cell B; a second unselected cell C, and a third unselected cell D that share the drain line CD2 with the selected cell A in the nonvolatile memory cell array as shown in FIG. 3 will be described. The first unselected cell B and the second unselected cell C also share the word line WL3 and the bit line BL3 with the selected cell A, respectively. A voltage of 3.0V to 6.0V is applied to the selected word line WL3 that is connected to the gate of the selected cell A, and a voltage of 0V is applied to the unselected words WL0–WL2 and WL4–WL7. Accordingly, a voltage ranging from 3.0V to 6.0V is applied to the gate of the first unselected cell B that shares the word line WL3 with the selected cell A, and a voltage of 0V is applied to the gates of the second unselected cell C and the third unselected cell D. And, a high voltage, for example, a voltage ranging from 3.0V to 6.0V is applied to the drain line CD2 that is connected to the drain when a voltage less than the increased threshold voltage is applied to the gate, a current does not flow in the programmed device.

In the nonvolatile memory cell having the structure of FIG. 2 according to the present invention, the erasing is achieved by applying a negative voltage to the gate G, applying a positive voltage to the drain D, and making the source S and the semiconductor substrate 100 to be grounded or floated. For example, in the nonvolatile memory cell array as shown in FIG. 3, the erasing is carried out by applying a negative voltage ranging from −6.0V to −5.0V to the word lines WL0–WL7 connected to the gates, applying a positive voltage ranging from 5.0V to 6.0V to the drain lines CD0–CD4 connected to the drains, making the bit lines BL0–BL7 connected to the sources to be grounded or floated, and applying a voltage of 0V to the semiconductor substrate.

EXAMPLE

In the nonvolatile memory cell array as shown in FIG. 3, observed was a change in the threshold voltage and current according to the programming of the first unselected cell B, the second unselected cell C and the third unselected cell D, which share the drain line CD2 with the selected cell A. The first unselected cell B and the second unselected cell C also share the word line WL3 and the bit line BL3 with the selected cell A, respectively. A voltage of 4V was applied to the selected word line WL3, which is connected to the gates of the selected cell A and the first unselected cell B. A voltage of 0V was applied to the word line WL4 of the second unselected cell C and the third unselected cell D. A voltage of 5V was applied to the drain line CD2, which is connected in common to the drains of the selected cell A, the first unselected cell B, the second unselected cell C, and the third unselected cell D. A voltage of 1V, which is smaller than that applied to the drain line CD2, was applied to the bit line BL3, which is connected to the sources of the selected cell A and the second unselected cell C, and a voltage of 4.6V was applied to the bit line BL2, which is connected to the first unselected cell B and the third unselected cell D.

Figure 4:
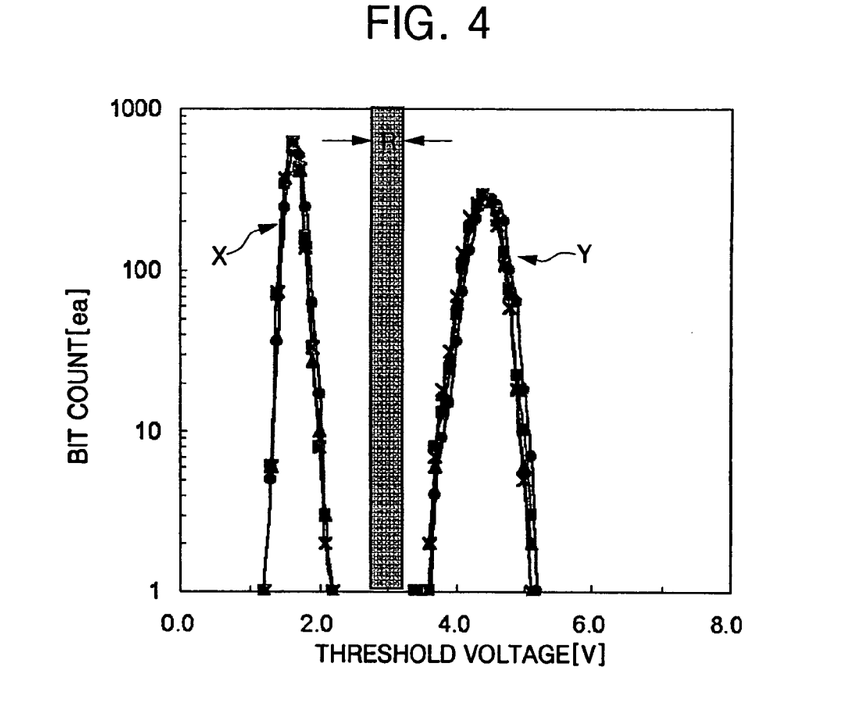
FIG. 4 is a graph showing changes in threshold voltages of programmed and unprogrammed cells according to the present invention.

FIG. 4 shows threshold voltage changes X in unselected cells and threshold voltage changes Y in selected cells according to the repetition of the example as described above. It shows the results of the threshold voltage changes X of the unselected cells, and the threshold voltage changes Y of the cells sharing the drain and word lines, the cells sharing the bit and drain lines, and the various types of unselected cells sharing only the drain line with the selected cell as described above. It is seen that the unselected cell, which shares bit and drain lines with the selected cell, is changed in its threshold voltage without a great difference from other types of unselected cells.

Figure 5:
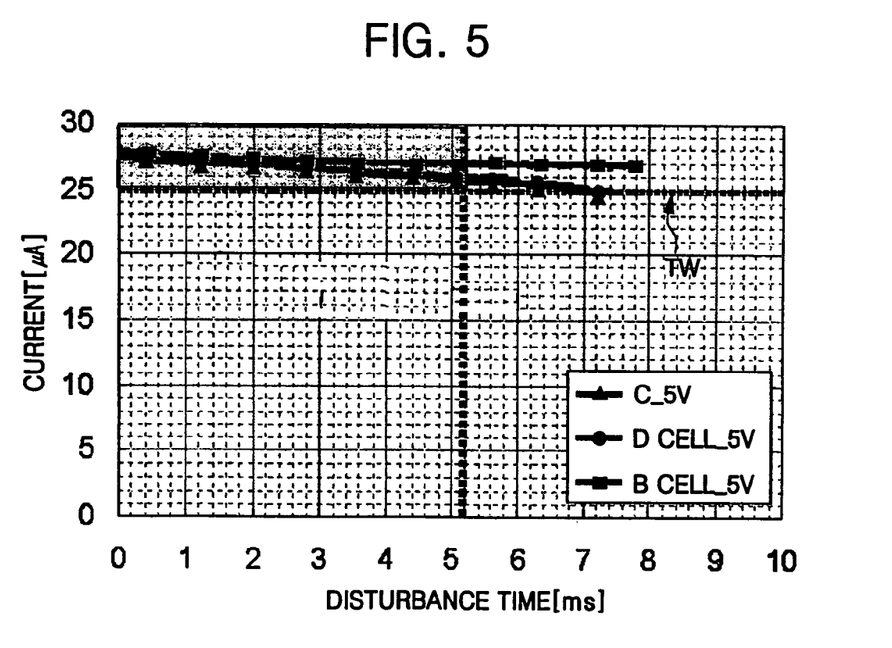
FIG. 5 is a graph showing a current change with respect to disturbance time.

FIG. 5 shows a change in current with respect to programming time, namely, disturbance time, in the above-described example. In the nonvolatile memory cell array, each of the currents of the first unselected cell B that shares the drain line with the selected cell, the second unselected cell C that shares drain and word lines with the selected cell, and the third unselected cell D that shares only the drain line was reduced to a width that is not larger than a target window. That is, it could be seen that a difference between changes in threshold voltages of various types of unselected cells is not large according to the nonvolatile memory cell array and the method of operating the same in accordance with the present invention.

Accordingly, it is expected that the threshold voltage according to the punch-through of the unselected cell, which shares the drain and bit lines with the selected cell, may be effectively reduced.

The present invention as described above includes an array of the nonvolatile memory cells in which the memory cells are arranged in a matrix form, each of which having a gate connected to a word line, a source connected to a bit line, a drain connected to a drain line, and a discrete charge storage region between the gate and the source/drain. In carrying out programming by applying a positive voltage to the gate of the selected cell and generating a potential difference between the drain and the source, it is possible to effectively prevent the threshold voltage of the unselected cell from being increased by applying a high voltage to the drains of the nonvolatile memory cells, which share at least the drain line with the selected cell, and applying a high voltage to the bit line, which is not connected to the selected cell.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of operating an array of nonvolatile memory cells in which memory cells are arranged in a matrix, each of the memory cells having a semiconductor substrate, a gate formed on the semiconductor substrate, a source and drain formed in the semiconductor substrate at both sides of the gate, and a charge storage region between the gate and the semiconductor substrate, the method comprising:
   selecting a cell from the array of nonvolatile memory cells;
   applying a positive voltage to a gate of the selected cell and to gates of first memory cells that share a word line with the selected cell;
   applying a first voltage to a drain of the selected cell and to drains of second memory cells that share at least a drain line with the selected cell; and
   applying a second voltage to a source of the selected cell and to sources of third memory cells that share a bit line with the selected cell, the second voltage being less than the first voltage, such that electrons are injected into the charge storage region of the selected cell to program, wherein a third voltage, which is higher than the second voltage, is applied to bit lines that are not connected to the selected cell, wherein the source includes:
   a first source region partially overlapped with the gate; and
   a second source region adjacent to the first source region and having a relatively higher concentration.

2. The method of claim 1, wherein the drain includes:
   an $n^-$ drain expansion region partially overlapped with the gate; and
   an $n^+$ drain region adjacent to the $n^-$ drain expansion region and having a relatively higher concentration.

3. The method of claim 2, wherein a $p^-$ region is formed adjacent to the bottom of the $n^-$ drain expansion region.

4. The method of claim 1, wherein the charge storage region has discrete charge trap sites.

5. The method of claim 4, wherein the charge storage region is formed of a silicon oxide layer, a silicon nitride layer, and a silicon oxide layer, which are stacked over the semiconductor substrate.

6. The method of claim 4, wherein the charge storage region is positioned closer to the drain than the source.

7. The method of claim 6, wherein the semiconductor substrate is a p-type conductive substrate, the first source region is an $n^-$ source expansion region, and the second source region is an $n^+$ source region.

8. The method of claim 6, wherein a voltage ranging from 3.0V to 6.0V is applied to the gate of the selected cell and the gates of the first memory cells that share the word line with the selected cell, and a voltage of 0V is applied to unselected word lines.

9. The method of claim 8, wherein a voltage ranging from 3.0V to 6.0V is applied as the first voltage.

10. The method of claim 9, wherein a voltage ranging from 0V to 1.0V is applied as the second voltage.

11. The method of claim 10, wherein a voltage ranging from 0V to 6.0V is applied as the third voltage.

12. The method of claim 6, further comprising:
   applying a negative voltage to the gates of the nonvolatile memory cells;
   applying a positive voltage to the drains of the nonvolatile memory cells; and
   allowing the sources of the nonvolatile memory cells to be grounded or floated so that electrons in the charge storage region are erased.

13. The method of claim 12, wherein erasing the electrons in the charge storage region is performed by:
applying a voltage ranging from −6.0V to −5.0V to the gates; and
applying a voltage ranging from 5.0V to 6.0V to the drains.

14. An array of nonvolatile memory cells in which the nonvolatile memory cells are arranged in a matrix, each of the nonvolatile memory cells comprising:
a gate formed on a semiconductor substrate and connected to a word line;
a source formed in the semiconductor substrate at one side of the gate and connected to a bit line;
a drain formed in the semiconductor substrate at the other side of the gate and connected to a drain line;
a charge storage region formed between the gate and the semiconductor substrate, the charge storage region being positioned closer to the drain than the source, wherein the source includes:
a first source region partially overlapped with the gate; and
a second source region adjacent to the first source region and having a relatively higher concentration.

15. The array of claim 14, wherein the charge storage region has discrete charge trap sites.

16. The array of claim 15, wherein the charge storage region includes a dielectric layer formed on the semiconductor substrate.

17. The array of claim 16, wherein the charge storage region is formed of a silicon oxide layer, a silicon nitride layer, and a silicon oxide layer, which are stacked over the semiconductor substrate.

18. The array of claim 14, wherein the semiconductor substrate is a p-type conductive substrate, the first source region is an $n^-$ source expansion region, and the second source region is an $n^+$ source region.

19. The array of claim 14, wherein the drain includes:
an $n^-$ drain expansion region partially overlapped with the gate; and
an $n^+$ drain region adjacent to the $n^-$ drain expansion region and having a relatively higher concentration.

20. The array of claim 19, further comprising a $p^-$ region adjacent to the bottom of the $n^-$ drain expansion region.

21. A method of operating an array of nonvolatile memory cells in which memory cells are arranged in a matrix, each of the memory cells having a semiconductor substrate, a gate formed on the semiconductor substrate, a source and drain formed in the semiconductor substrate at both sides of the gate, and a charge storage region between the gate and the semiconductor substrate, the method comprising:
applying a positive voltage to a gate of a selected cell and gates of memory cells that share a word line with the selected cell;
applying a first voltage to a drain of the selected cell and drains of memory cells that share at least a drain line with the selected cell; and
applying a second voltage to a source of the selected cell and sources of memory cells that share a bit line with the selected cell, the second voltage being less than the first voltage, such that electrons are injected into the charge storage region of the selected cell to program, wherein a third voltage, which is higher than the second voltage, is applied to bit lines that are not connected to the selected cell, wherein the charge storage region has discrete charge trap sites, wherein the charge storage region is positioned closer to the drain than the source, and wherein the semiconductor substrate is a p-type conductive substrate and the source includes:
an $n^-$ source expansion region partially overlapped with the gate; and
an $n^+$ source region adjacent to the $n^-$ source expansion region.

22. The method of claim 21, wherein the drain includes:
an $n^-$ drain expansion region partially overlapped with the gate; and
an n+ drain region adjacent to the n− drain expansion region and having a relatively higher concentration.

23. The method of claim 22, wherein a p− region is formed adjacent to the bottom of the n− drain expansion region.

24. A method of operating an array of nonvolatile memory cells in which memory cells are arranged in a matrix, each of the memory cells having a semiconductor substrate, a gate formed on the semiconductor substrate, a source and drain formed in the semiconductor substrate at both sides of the gate, and a charge storage region between the gate and the semiconductor substrate, the method comprising:
applying a positive voltage to a gate of a selected cell and gates of memory cells that share a word line with the selected cell;
applying a first voltage to a drain of the selected cell and drains of memory cells that share at least a drain line with the selected cell; and
applying a second voltage to a source of the selected cell and sources of memory cells that share a bit line with the selected cell, the second voltage being less than ihe first voltage, such that electrons are injected into the charge storage region of the selected cell to program, wherein a third voltage, which is higher than the second voltage, is applied to bit lines that are not connected to the selected cell, wherein the charge storage region has discrete charge trap sites, wherein the charge storage region is positioned closer to the drain than the source, and wherein a voltage ranging from 3.0V to 6.0V is applied to the gate of the selected cell and the gates of the nonvolatile memory cells that share the selected word line, and a voltage of 0V is applied to unselected word lines.

25. The method of claim 24, wherein a voltage ranging from 3.0V to 6.0V is applied as the first voltage.

26. The method of claim 25, wherein a voltage ranging from 0V to 1.0V is applied as the second voltage.

27. The method of claim 26, wherein a voltage ranging from 0V to 6.0V is applied as the third voltage.

28. A method of operating an array of nonvolatile memory cells in which memory cells are arranged in a matrix, each of the memory cells having a semiconductor substrate, a gate formed on the semiconductor substrate, a source and drain formed in the semiconductor substrate at both sides of the gate, and a charge storage region between the gate and the semiconductor substrate, the method comprising:
applying a positive voltage to a gate of a selected cell and gates of memory cells that share a word line with the selected cell;
applying a first voltage to a drain of the selected cell and drains of memory cells that share at least a drain line with the selected cell; and
applying a second voltage to a source of the selected cell and sources of memory cells that share a bit line with the selected cell, the second voltage being less than the first voltage, such that electrons are injected into the charge storage region of the selected cell to program, wherein a third voltage, which is higher than the second voltage, is applied to bit lines that are not connected to the selected cell, wherein the charge storage region has discrete charge trap sites, wherein the charge storage region is positioned closer to the drain than the source, and further comprising:

applying a negative voltage to the gates of the nonvolatile memory cells;

applying a positive voltage to the drains of the nonvolatile memory cells; and allowing the sources of the nonvolatile memory cells to be ground electrons in the charge storage region are erased.

29. The method of claim 28, wherein erasing the electrons in the charge storage region is performed by:

applying a voltage ranging from −6.0V to −5.0V to the gates; and applying a voltage ranging from 5.0V to 6.0V to the drains.

30. An array of nonvolatile memory cells in which the nonvolatile memory cells are arranged in a matrix, each of the nonvolatile memory cells comprising:

a gate formed on a semiconductor substrate and connected to a word line;

a source formed in the semiconductor substrate at one side of the gate and connected to a bit line;

a drain formed in the semiconductor substrate at the other side of the gate and connected to a drain line; and a charge storage region formed between the gate and the semiconductor substrate, the charge storage region being positioned closer to the drain than the source, wherein the nonvolatile memory cells connected to at least two word lines are connected to a common drain line, and wherein the semiconductor substrate is a p-type conductive substrate and the source includes:

an $n^-$ source expansion region partially overlapped with the gate; and an $n^+$ source region adjacent to the n source expansion region.

31. The array of claim 30, wherein the drain includes:

an $n^-$ drain expansion region partially overlapped with the gate; and an $n^+$ drain region adjacent to the n drain expansion region and having a relatively higher concentration.

32. The array of claim 31, further comprising a $p^-$ region adjacent to the bottom of the $n^-$ drain expansion region.

* * * * *

UNITED STATES PATENT AND TRADEMARK OFFICE
CERTIFICATE OF CORRECTION

PATENT NO. : 7,184,316 B2 Page 1 of 1
APPLICATION NO. : 11/038726
DATED : February 27, 2007
INVENTOR(S) : Cho et al.

It is certified that error appears in the above-identified patent and that said Letters Patent is hereby corrected as shown below:

Column 10, line 30, delete "ihe" and insert --the--

Column 12, line 13, delete "n" and insert -- n- --

Column 12, line 20, delete "n" and insert -- n- --

Signed and Sealed this

Third Day of July, 2007

JON W. DUDAS
*Director of the United States Patent and Trademark Office*